(12) United States Patent
Tamoyama et al.

(10) Patent No.: US 7,876,513 B2
(45) Date of Patent: Jan. 25, 2011

(54) CAMERA MODULE AND METHOD FOR MANUFACTURING THE SAME

(75) Inventors: Masaki Tamoyama, Iwate-ken (JP); Junichi Abe, Iwate-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 12/415,409

(22) Filed: Mar. 31, 2009

(65) Prior Publication Data

US 2009/0244728 A1 Oct. 1, 2009

(30) Foreign Application Priority Data

Apr. 1, 2008 (JP) .............................. 2008-095176

(51) Int. Cl.
*G02B 7/02* (2006.01)
*G02B 15/14* (2006.01)
*G03B 17/00* (2006.01)

(52) U.S. Cl. ........................ 359/819; 359/811; 359/694; 396/275

(58) Field of Classification Search ......... 359/694–704, 359/811–824; 396/275, 529, 542; 348/335, 348/340, 374
See application file for complete search history.

(56) References Cited

U.S. PATENT DOCUMENTS

| 7,720,374 B2 * | 5/2010 | Kim et al. ................... 396/275 |
| 2009/0284631 A1* | 11/2009 | Matsuo et al. .............. 348/294 |
| 2010/0142066 A1* | 6/2010 | Okabe et al. ................ 359/824 |

FOREIGN PATENT DOCUMENTS

JP 2005-229431 8/2005

* cited by examiner

*Primary Examiner*—Mohammed Hasan
(74) *Attorney, Agent, or Firm*—Oblon, Spivak, McClelland, Maier & Neustadt, L.L.P.

(57) ABSTRACT

The camera module comprises: an insulating substrate 13 having an imaging device 18 on a front face thereof and a plurality of solder balls 21 on a rear face thereof; a cylindrical lens holder 14 securely fixed on the substrate 13, composed of an upper large-diameter portion 14-1 and a lower small-diameter portion 14-2 and having a lens 15 therein; a cylindrical shield 12 fitted onto the small-diameter portion 14-2 of the lens holder and composed of a cylindrical side portion 12-2 fixed on the large-diameter portion 14-1 of the lens holder and a plate-shaped bottom portion 12-1 in contact with the rear face of the insulating substrate 13 and having an opening 12-1a for conduction; and a mounting board 11 connected with the insulating substrate 13 by the plurality of solder balls 21 formed on the rear face of the insulating substrate 13.

3 Claims, 3 Drawing Sheets

CAMERA MODULE AND METHOD FOR MANUFACTURING THE SAME

CROSS REFERENCE TO RELATED APPLICATIONS

This application is based upon and claims the benefit of priority from the prior Japanese Patent Application No. 2008-095176 filed in Japan on Apr. 1, 2008; the entire contents of which are incorporated herein by reference.

TECHNICAL FIELD

The present invention relates to a camera module and, in particular, relates to a camera module capable of being fixed with high accuracy at a determined position on a mounting board.

BACKGROUND ART

A miniature camera for a mobile phone or the like is equipped with a camera module. The conventional camera module is composed by securely fitting a lens holder fixed on an insulating substrate inside a shield fixed on a mounting board.

The lens holder is of a cylindrical shape having an opening in an upper portion thereof and has a lens therein. The lens holder is disposed on the insulating substrate in such a manner as to cover an imaging device positioned on the insulating substrate and is fixed by an adhesive.

The shield is composed of a top plate having an opening and a cylindrical side portion formed under an outer peripheral portion of the top plate. The outer peripheral portion is adapted to the shape of the lens holder. The shield is disposed on the mounting board in such a manner as to cover the lens holder fixed on the insulating substrate and is fixed by an adhesive.

In addition, there is electrical continuity between the rear face of the insulating substrate on which the lens holder is fixed and the front face of the mounting board by solder balls formed therebetween (Japanese Patent Application Laid-Open No. 2005-229431).

However, the conventional camera module has manufacturing errors in respective portions, such as the height of the shield side portion, the height of the lens holder, the thickness of the insulating substrate, the thickness of an adhesive between the lower portion of the lens holder and the front face of the insulating substrate and the thickness of an adhesive between the lens holder and the shield top plate. Therefore, there has been a problem that it is difficult to flatten a surface defined by the lower end of the shield and lower portions of solder balls. If the flatness of the surface is low in this manner, there has been a problem that only either one of solder balls formed on the rear face of the insulating substrate and the lower end of the shield is fixed onto the mounting board and the other is not in contact with the mounting board.

DISCLOSURE OF THE INVENTION

It is an object of the present invention to provide a camera module which allows a shield having a lens holder therein to be fixed with high accuracy.

According to an aspect of the present invention, there is provided a camera module, including: an insulating substrate having a plurality of solder balls on a rear face thereof; a cylindrical lens holder fixed on the substrate and composed of an upper large-diameter portion and a lower small-diameter portion; a cylindrical shield fitted onto the small-diameter portion of the lens holder and composed of a cylindrical side portion fixed on the rear face of the large-diameter portion of the lens holder and a plate-shaped bottom portion in contact with the rear face of the insulating substrate and having an opening for conduction; and a mounting board connected with the insulating substrate by the plurality of solder balls formed on the rear face of the insulating substrate.

According to another aspect of the present invention, there is provided a camera module including: an insulating substrate having an imaging device on a front face thereof and a plurality of solder balls on a rear face thereof; a cylindrical barrel fixed on the substrate, composed of an upper large-diameter portion and a lower small-diameter portion and having a threaded groove in an inner side face thereof; a lens holder having a threaded groove corresponding to the threaded groove in the inner side face of the barrel in an outer side face thereof, retained by the barrel with the threaded groove and having a lens disposed therein; a cylindrical shield fitted onto the small-diameter portion of the barrel and composed of a cylindrical side portion fixed on the rear face of the large-diameter portion of the barrel and a plate-shaped bottom portion in contact with the rear face of the insulating substrate and having an opening for conduction; and a mounting board connected with the insulating substrate by the plurality of solder balls formed on the rear face of the insulating substrate.

According to another aspect of the present invention, there is provided a method for manufacturing a camera module, including the steps of: fixing a lens holder on an insulating substrate by applying a first adhesive between the insulating substrate and a lower end of the lens holder, the insulating substrate having an imaging device disposed on a front face or a rear face thereof, the lens holder having a lens therein and being composed of an upper large-diameter portion and a lower small-diameter portion; after turning upside down the lens holder fixed on the insulating substrate by the above step, forming a plurality of solder balls on the rear face of the insulating substrate or on the imaging device; disposing a shield composed of a cylindrical side portion fitted onto the small-diameter portion of the lens holder and a plate-shaped bottom portion having an opening for conduction in such a manner that the bottom portion of the shield is in contact with the rear face of the insulating substrate or the imaging device and applying a second adhesive between a side portion upper end of the disposed shield and a rear face of the large-diameter portion of the lens holder; pressing the insulating substrate against a front face of a mounting board in such a manner that the bottom portion of the shield is inserted between the mounting board and the insulating substrate or the imaging device; and curing the second adhesive in such a state that the bottom portion of the shield is inserted between the mounting board and the insulating substrate or the imaging device.

DETAILED DESCRIPTION OF THE INVENTION

Referring now to FIGS. 1 to 6, detailed description will be made below on a camera module according to embodiments of the present invention.

First Embodiment

Figure 1:
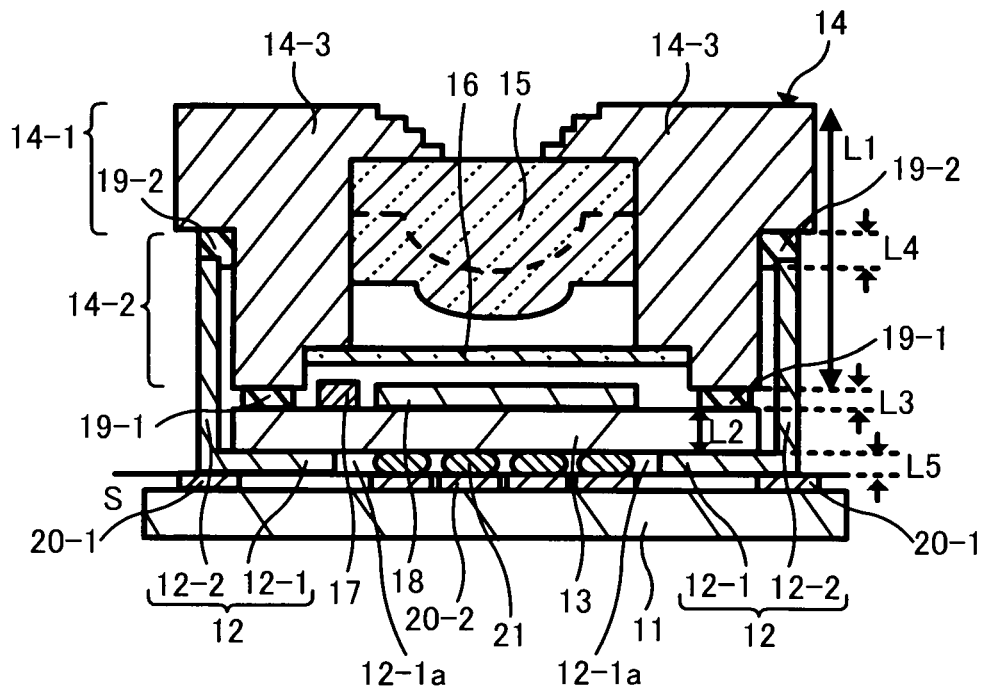
FIG. 1 is a sectional view of a camera module according to a first embodiment.

FIG. 1 is a sectional view of a camera module according to a first embodiment of the present invention.

As illustrated in FIG. 1, in a camera module according to the first embodiment, a bottomed cylindrical shield 12 is fixed on a mounting board 11. On an inner face of the shield 12, there is securely fitted a lens holder 14 fixed on an insulating substrate 13.

The lens holder 14 has a cylindrical shape composed of a large-diameter portion 14-1 and a small-diameter portion 14-2. The small-diameter portion 14-2 is formed integrally with a lower portion of the large-diameter portion 14-1. The large-diameter portion 14-1 has a lid 14-3 having an opening for light incidence in the center at the upper portion thereof. The cylindrical shape used herein means not only a tubular shape having an approximately circular cross section but also any shape other than an approximately circular cross section, for example, a tubular shape having a polygonal cross section. In the present embodiment, however, the cylindrical shape is a tubular shape having an approximately circular cross section. Hereinafter, all the cylindrical shapes have the same meaning.

Inside the lens holder 14, a lens 15 is disposed in contact with the lid 14-3. Further, inside the lens holder 15, an infrared cut filter 16 is disposed. The infrared cut filter 16 is disposed below the lens 15.

The lens holder 14 is disposed in such a manner that the small-diameter portion 14-2 covers a passive device 17 and an imaging device 18 disposed on the insulating substrate 13. In addition, the lens holder 14 is fixed on the insulating substrate 13 by a first adhesive 19-1 applied between the lower portion of the small-diameter portion 14-2 and the front face of the insulating substrate 13.

The shield 12 on the mounting board 11 is composed of a plate-shaped bottom portion 12-1 in which an opening 12-1a for conduction is formed in the center thereof and a cylindrical side portion 12-2. The cylindrical side portion 12-2 is formed integrally with the bottom portion 12-1 on the outer peripheral portion of the bottom portion 12-1. The shield 12 is made of metal or a conductive resin whose surface is covered with a conductive film.

The shield 12 is fixed on the mounting board 11 by a first solder paste 20-1 formed between the outer peripheral portion of the bottom portion 12-1 and the mounting board 11.

Inside the shield 12 thus fixed on the mounting board 11, the lens holder 14 on the insulating substrate 13 is disposed in such a manner that an outer face of the small-diameter portion 14-2 and an inner face of the side portion 12-2 of the shield 12 are fitted to each other. The lens holder 14 is fixed by a second adhesive 19-2 applied between a lower portion of the large-diameter portion 14-1 of the lens holder 14 and an upper end of the side portion 12-2 of the shield 12.

Further, a plurality of solder balls 21 are formed on the rear face of the insulating substrate 13 fixed inside the shield 12. On the mounting board 11, there is formed second solder pastes 20-2 at positions corresponding to the positions of the plurality of solder balls 21 formed on the rear face of the insulating substrate 13. The solder balls 21 and second solder pastes 20-2 are formed to be joined inside the opening 12-1a for conduction formed in the plate-shape bottom 12-1 of the shield 12, and by joining the solder balls 21 and second solder pastes 20-2, electrical continuity between the insulating substrate 13 and the mounting board 11 is established.

In the camera module according to the first embodiment described above, the shield 12 is fixed in such a manner that the bottom portion 12-1 of the shield 12 is in contact with the rear face of the insulating substrate 13.

Because the shield 12 is fixed in this way, the flatness of a surface S defined by the rear face of the bottom portion 12-1 of the shield 12 and the lower portions of solder balls 21 is determined only by the thickness L5 of the bottom portion 12-1 of the shield 12, regardless of the height L1 of the lens holder 14, the thickness L2 of the insulating substrate 13, the thickness L3 of the first adhesive 19-1 on the insulating substrate 13 and the thickness L4 of the second adhesive 19-2 on the upper end of the side portion 12-2 of the shield 12. This is because manufacturing errors of the height L1 of the lens holder 14 and the thickness L2 of the insulating substrate 13 are compensated by the thickness L4 of the second adhesive 19-2. Hence, as compared with the conventional camera module, it is possible to easily control the flatness of the surface S defined by the rear face of the bottom portion 12-1 of the shield 12 and the lower portions of solder balls 21. Improvement in the flatness of the surface S facilitates mounting of the shield 12 in such a manner that solder balls 21 and the shield 12 come into contact with the mounting board 11.

According to the camera module of the first embodiment, the bottom portion 12-1 of the shield 12 is formed between the insulating substrate 13 on which the imaging device 18 is disposed and the mounting board 11, which provides an effect of mutually blocking electromagnetic waves emitted from the insulating substrate 13 and the mounting board 11.

Figure 2:
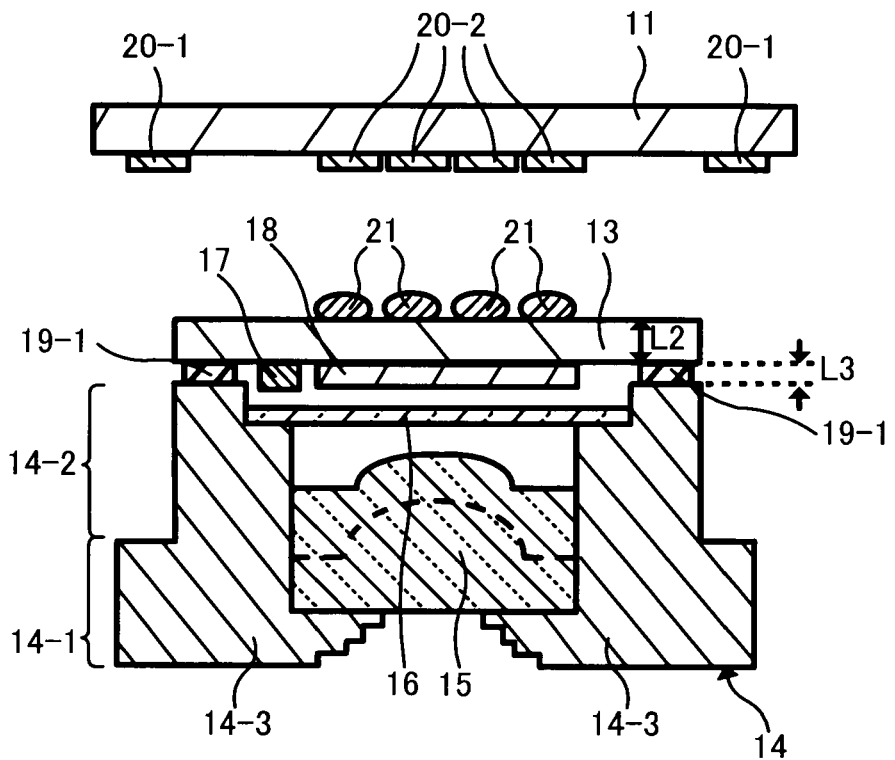
FIG. 2 is a sectional view for illustrating a method for manufacturing the camera module according to the first embodiment.
Figure 3:
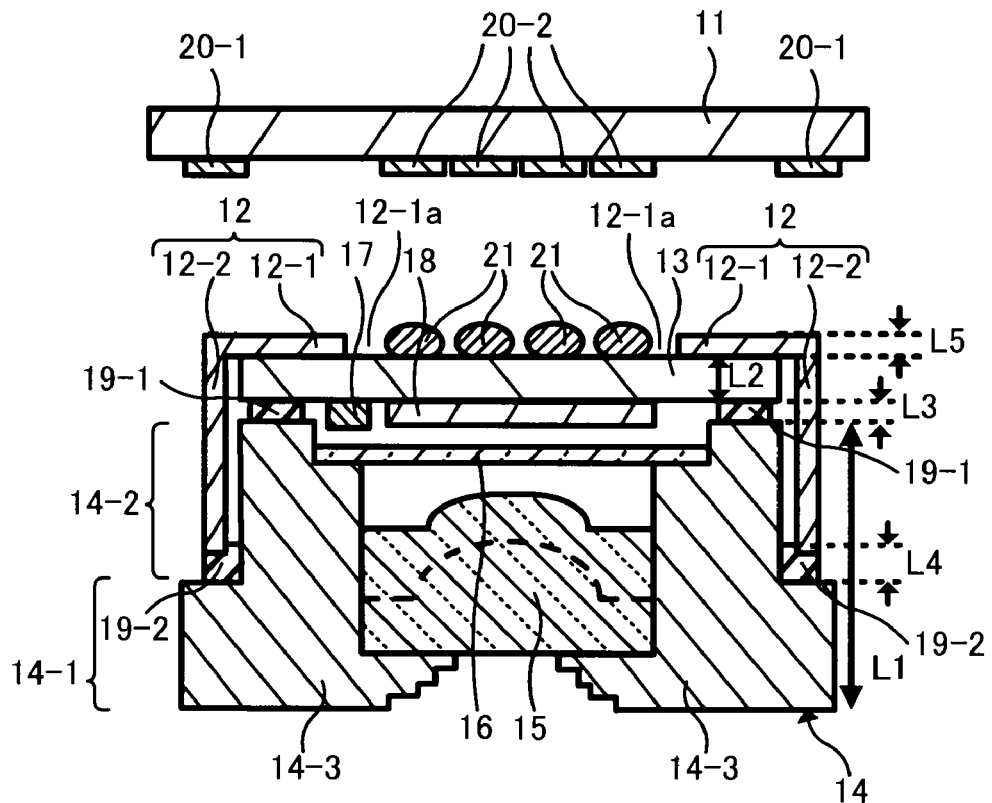
FIG. 3 is a sectional view for illustrating a method for manufacturing the camera module according to the first embodiment.
Figure 4:
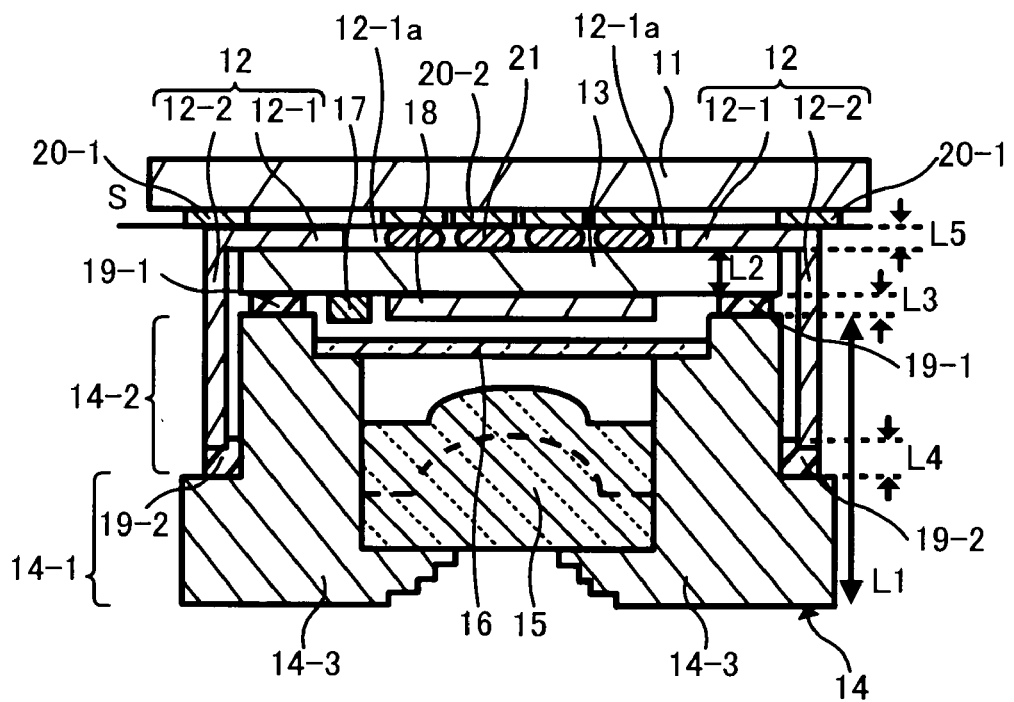
FIG. 4 is a sectional view for illustrating a method for manufacturing the camera module according to the first embodiment.

Referring next to FIGS. 2 to 4, a method for manufacturing the camera module according to the first embodiment will be described.

First, the first adhesive 19-1 is applied to a predetermined position on the insulating substrate 13 on which the passive device 17 and the imaging device 18 are disposed. Then, the lens holder 14 is disposed on the applied first adhesive 19-1. The first adhesive 19-1 used is, for example, a UV curing adhesive or an adhesive using the UV curing adhesive and a thermosetting adhesive in combination.

Next, the first adhesive 19-1 is irradiated with ultraviolet rays to cure the adhesive 19-1 and the lens holder 14 is fixed on the insulating substrate 13.

Next, as illustrated in FIG. 2, the insulating substrate 13 on which the lens holder 14 is fixed is turned upside down and a plurality of solder balls 21 are formed at predetermined positions on the rear face of the insulating substrate 13. The plurality of solder balls 21 are formed in such a manner that the height of the plurality of solder balls 21 are higher than the thickness L5 of the bottom portion 12-1 of the shield 12 to be disposed later. Meanwhile, the first solder paste 20-1 and the second solder pastes 20-2 are formed at predetermined positions on the mounting board 11 and the mounting board 11 is turned upside down.

Next, as illustrated in FIG. 3, the shield 12 is disposed in such a manner that the bottom portion 12-1 of the shield 12 comes into contact with the rear face of the insulating substrate 13. And the second adhesive 19-2 is applied between the upper end (lower end in an upside-down state) of the side portion 12-2 of the shield 12 and the lower portion (upper portion in an upside-down state) of the large-diameter portion 14-1. The second adhesive 19-2 used is also, for example, a UV curing adhesive or an adhesive using the UV curing adhesive and a thermosetting adhesive in combination.

Finally, as illustrated in FIG. 4, the lens holder 14 fixedly attached with the insulating board 13 is pressed from below against the mounting board 11 in such a manner that the bottom portion 12-1 of the shield 12 comes into contact with the first solder paste 20-1 formed on the mounting board 11 and that solder balls 21 come into contact with the second solder paste 20-2. With the lens holder 14 pressed from below, the second adhesive 19-2 on the upper end of the side portion 14-2 of the lens holder 14 is irradiated with ultraviolet rays for curing to fixedly attach the lens holder 14 onto the shield 12.

By the processes described above, the camera module according to the present embodiment can be manufactured.

As described above, since the second adhesive 19-2 is cured in a state where the bottom portion 12-1 of the shield 12 is in contact with the first solder paste 20-1 formed on the mounting board 11 and where solder balls 21 are in contact with second solder pastes 20-2, the surface S defined by the lower face (upper face in an upside-down state) of the bottom portion 12-1 of the shield 12 and the lower portions (upper portions in an upside-down state) of solder balls 21 can be flattened.

Even if the surface S is not completely flat, the shield 12 is fixedly attached in such a manner that older balls 21 are buried in the second solder pastes 20-2 formed on the mounting board 11, thereby it is possible to compensate for the flatness of the surface S.

Second Embodiment

Figure 5:
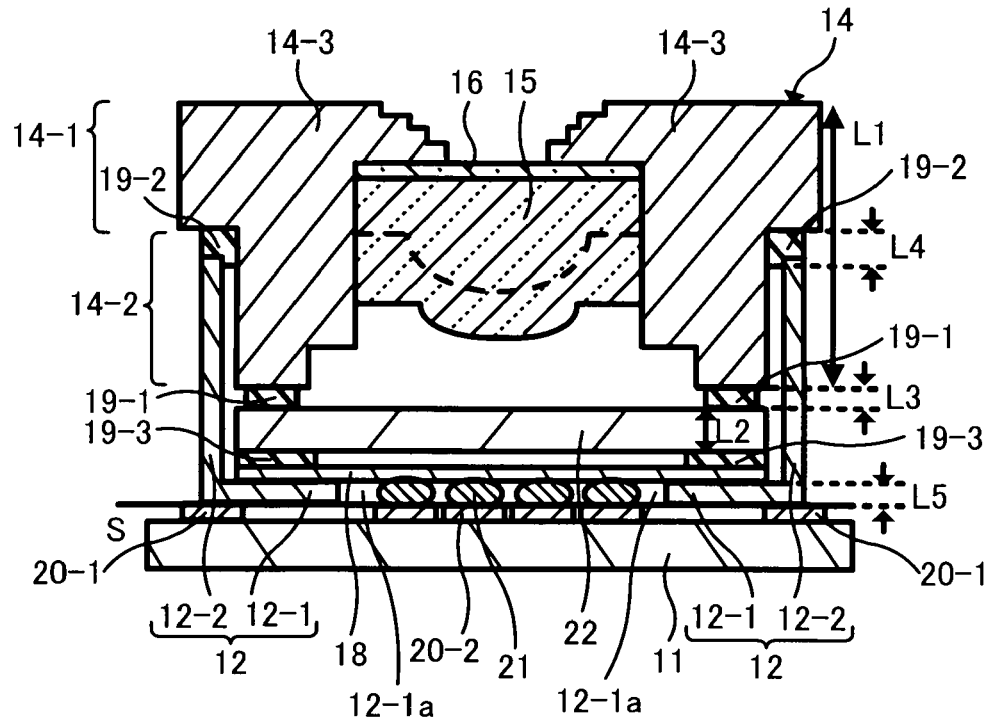
FIG. 5 is a sectional view of a camera module according to a second embodiment.

FIG. 5 is a sectional view of a camera module according to a second embodiment of the present invention.

As illustrated in FIG. 5, in the camera module according to the second embodiment, a bottomed cylindrical shield 12 is fixed on a mounting board 11 in the same way as the camera module according to the first embodiment. On an inner face of the shield 12, there is securely fitted a lens holder 14 fixed on an insulating substrate 13. However, in the camera module according to the second embodiment, the insulating substrate 13 is a glass substrate 22. On a rear face of the glass substrate 22, an imaging device 18 is fixed through a third adhesive 19-3.

Similarly to the camera module according to the first embodiment, the lens holder 14 has a cylindrical shape composed of a large-diameter portion 14-1 and a small-diameter portion 14-2. The small-diameter portion 14-2 is formed integrally with a lower portion of the large-diameter portion 14-1. The large-diameter portion 14-1 has a lid 14-3 having an opening for light incidence in the center at the upper portion thereof.

However, inside the lens holder 14, an infrared cut filter 16 is disposed in contact with the lid 14-3. Inside the lens holder 15, a lens 15 is further disposed in contact with the infrared cut filter 16.

The lens holder 14 is fixed on the glass substrate 22 by a first adhesive 19-1 applied between a lower portion of the small-diameter portion 14-2 and a front face of the glass substrate 22.

Similarly to the camera module of the first embodiment, the shield 12 on the mounting board 11 is composed of a plate-shaped bottom portion 12-1 in which an opening 12-1a for conduction is formed in the center thereof and a cylindrical side portion 12-2. The cylindrical side portion 12-2 is formed integrally with the bottom portion 12-1 on an outer peripheral portion of the bottom portion 12-1. The shield 12 is made of metal or conductive resin whose surface is covered with a conductive film.

The shield 12 is fixed on the mounting board 11 by a first solder paste 20-1 formed between the outer peripheral portion of the bottom portion 12-1 and the mounting board 11.

Inside the shield 12 fixed on the mounting board 11 in this way, the lens holder 14 fixed on the glass substrate 22 is disposed in such a manner that an outer face of the small-diameter portion 14-2 and an inner face of the side portion 12-2 of the shield 12 are fitted to each other. The lens holder 14 is fixed by a second adhesive 19-2 applied between a lower portion of the large-diameter portion 14-1 of the lens holder 14 and an upper end of the side portion 12-2 of the shield 12.

Further, a plurality of solder balls 21 are formed on a front face of the imaging device 18 on a rear face of the glass substrate 22 fixed inside the shield 12. On the mounting board 11, there is formed second solder pastes 20-2 at positions corresponding to the positions of the plurality of solder balls 21 formed on the front face of the imaging device 18. Solder balls 21 and second solder pastes 20-2 are formed to be joined inside the opening 12-1a for conduction formed at the plate-shape bottom 12-1 of the shield 12, and by joining solder balls 21 and the second solder paste 20-2, electrical continuity between the imaging device 18 and the mounting board 11 is established.

In the camera module according to the second embodiment described above, the shield 12 is fixed in such a manner that the bottom portion 12-1 of the shield 12 is in contact with the front face of the imaging device 18.

Because the shield 12 is fixed in this way, the flatness of a surface S defined by the rear face of the bottom portion 12-1 of the shield 12 and the lower portions of solder balls 21 is determined only by the thickness L5 of the bottom portion 12-1 of the shield 12, regardless of the height L1 of the lens holder 14, the thickness L2 of the glass substrate 22, the thickness L3 of the first adhesive 19-1 on the glass substrate 22 and the thickness L4 of the second adhesive 19-2 on the upper end of the side portion 12-2 of the shield 12. Hence, as compared with the conventional camera module, it is possible to easily control the flatness of a surface S defined by the rear face of the bottom portion 12-1 of the shield 12 and the lower portions of solder balls 21. Improvement in the flatness of the surface S facilitates mounting of the shield 12 in such a manner that solder balls 21 and the shield 12 come into contact with the mounting board 11.

According to the camera module of the second embodiment, the bottom portion 12-1 of the shield 12 is formed between the imaging device 18 and the mounting board 11 and hence there is also an advantageous effect that electromagnetic waves emitted from the imaging device 18 and the mounting board 11 are mutually blocked.

A method for manufacturing the camera module according to the second embodiment is almost the same as that according to the first embodiment. Therefore, the description thereof will not be repeated, and the method for manufacturing of the camera module according to the second embodiment provides the same advantageous effects as those according to the first embodiment.

The above description is made on embodiments of such a camera module in which the lens holder 14 is fixed on the insulating substrate 13 or the glass substrate 22. However, the present invention is also applicable to such a camera module in which the lens holder 14 is retained by a barrel 23, which will be described below, and the barrel 23 is fixed on the insulating substrate 13. The barrel 23 described below is a type of lens holders.

An embodiment of the camera module will be described below.

Third Embodiment

Figure 6:
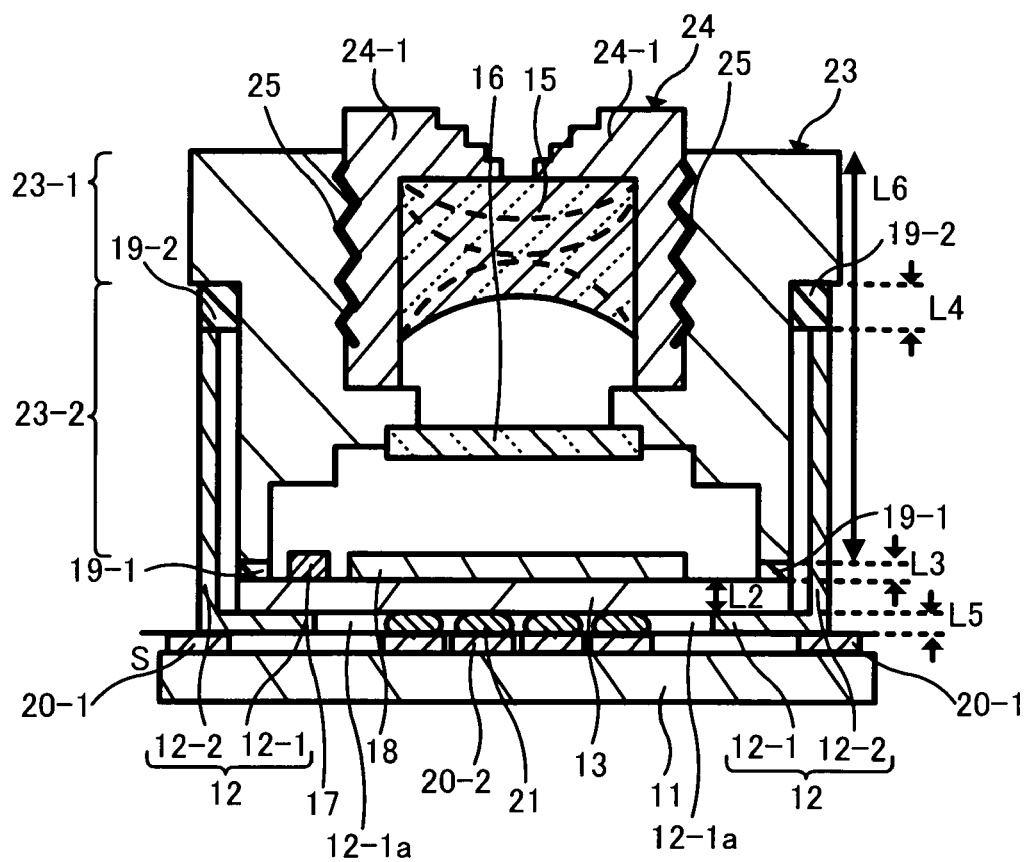
FIG. 6 is a sectional view of a camera module according to a third embodiment.

FIG. 6 is a sectional view of a camera module according to a third embodiment.

As illustrated in FIG. 6, in the camera module according to the third embodiment, a bottomed cylindrical shield 12 is fixed on a mounting board 11. On an inner face of the shield 12, there is securely fitted a barrel 23 retaining a lens holder 24 therein.

The lens holder 24 has a cylindrical shape with a threaded groove 25 formed in an outer side face thereof and a lid 24-1 having an opening for light incidence in the center at the upper portion thereof. Inside the lens holder 24, there is disposed a lens 15 in contact with the lid 24-3.

The barrel 23 retaining the lens holder 24 has a cylindrical shape composed of a large-diameter portion 23-1 and a small-diameter portion 23-2. The small-diameter portion 23-2 is formed at a lower portion of the large-diameter portion 23-1. Inside the barrel 23, there is disposed an infrared cut filter 16. A threaded groove 25 is formed in an inner side face of the barrel 23 above the infrared cut filter 16.

Therefore, the lens holder 24 can be fixed inside the barrel 23 by the threaded groove 25 in the inner side face of the barrel 23 and the threaded groove 25 in the outer side face of the lens holder 24.

In the barrel 23 retaining the lens holder 24 therein in this way, the small-diameter portion 24-2 is disposed in such a manner as to cover a passive device 17 and an imaging device 18 disposed on the insulating substrate 13. The barrel 23 is fixed on an insulating substrate 13 by a first adhesive 19-1 applied between a lower portion of a small-diameter portion 14-2 and a front face of the insulating substrate 13.

Similarly to the camera module of the first or second embodiment, the shield 12 on the mounting board 11 is composed of a plate-shaped bottom portion 12-1 in which an opening 12-1a for conduction is formed in the center thereof and a cylindrical side portion 12-2. The cylindrical side portion 12-2 is formed integrally with the bottom portion 12-1 on an outer peripheral portion of the bottom portion 12-1. The shield 12 is made of metal or a conductive resin whose surface is covered with a conductive film.

The shield 12 is fixed on the mounting board 11 by a first solder paste 20-1 formed between the outer peripheral portion of the rear face of the bottom portion 12-1 and the mounting board 11.

Inside the shield 12 fixed on the mounting board 11 in this way, there is disposed the barrel 23 fixed on the insulating substrate 13 in such a manner that an outer face of the small-diameter portion 23-2 and an inner face of the side portion 12-2 of the shield 12 are fitted to each other. The barrel 23 is fixed by a second adhesive 19-2 applied between a lower portion of the large-diameter portion 23-1 of the barrel 23 and an upper end of the side portion 12-2 of the shield 12.

Further, a plurality of solder balls 21 are formed on a rear face of the insulating substrate 13 fixed inside the shield 12. On the mounting board 11, there is formed a second solder paste 20-2 at positions corresponding to the positions of the plurality of solder balls 21 formed on the rear face of the insulating substrate 13. Solder balls 21 and second solder pastes 20-2 are formed in such a manner as to be joined inside the opening 12-1a for conduction formed in the plate-shape bottom 12-1 of the shield 12, and by joining solder balls 21 and second solder pastes 20-2, electrical continuity between the insulating substrate 13 and the mounting board 11 is established.

In the camera module according to the third embodiment described above, the shield 12 is fixed in such a manner that the bottom portion 12-1 of the shield 12 is in contact with the rear face of the insulating substrate 13.

Because the shield 12 is fixed in this way, the flatness of a surface S defined by the lower face of the bottom portion 12-1 of the shield and the lower portions of solder balls 21 is determined only by the thickness L5 of the bottom portion 12-1 of the shield, regardless of the height L6 of the barrel 23, the thickness L2 of the insulating substrate 13, the thickness L3 of the first adhesive 19-1 on the insulating substrate 13 and the thickness L4 of the second adhesive 19-2 on the upper end of the side portion 12-2 of the shield 12. This is because manufacturing errors of the height L6 of the barrel 23 and the thickness L2 of the insulating substrate 13 are compensated by the thickness L4 of the second adhesive 19-2. Hence, as compared with the conventional camera module, it is possible to easily control the flatness of a surface S defined by the rear face of the bottom portion 12-1 of the shield 12 and the lower portions of solder balls 21. Improvement in the flatness of the surface S facilitates mounting of the shield 12 in such a manner that solder balls 21 and the shield 12 come into contact with the mounting board 11.

In the camera module according to the third embodiment, the bottom portion 12-1 of the shield 12 is formed between the insulating substrate 13 and the mounting board 11, which also provides the advantageous effect that electromagnetic waves emitted from the insulating substrate 13 and the mounting board 11 are mutually blocked.

A method for manufacturing the camera module according to the third embodiment is almost the same as that according to the first embodiment. Therefore, the description thereof will not be repeated, and the method for manufacturing the camera module according to the third embodiment provides the same advantageous effects as those according to the first embodiment.

The embodiments of the present invention have been described above, but the present invention is not limited thereto.

For example, the present invention is applicable to any camera module in which a lens holder 14, 24 having at least a lens 15 is fixed on a mounting board 11 through a shield 12.

In the embodiments described above, preferably, the first adhesive 19-1, the second adhesive 19-2 and the third adhesive 19-3 are a UV curing adhesive which is advantageous in the manufacture in terms of a short curing period and few curing fluctuations or adhesive using the UV curing adhesive and a thermosetting adhesive in combination. However, the first adhesive 19-1, the second adhesive 19-2 and the third adhesive 19-3 are not limited thereto. Use of any other adhesive does not eliminate the advantageous effects of the present invention.

The invention claimed is:

1. A method for manufacturing a camera module, comprising the steps of:

fixing a lens holder on an insulating substrate by applying a first adhesive between the insulating substrate and a lower end of the lens holder, the insulating substrate having an imaging device disposed on a front face or a rear face thereof, the lens holder having a lens therein and including an upper large-diameter portion and a lower small-diameter portion;

after turning upside down the lens holder fixed on the insulating substrate by the above step, forming a plurality of solder balls on the rear face of the insulating substrate or on the imaging device;

disposing a shield including a cylindrical side portion fitted onto the small-diameter portion of the lens holder and a plate-shaped bottom portion having an opening for conduction in such a manner that the bottom portion of the shield is in contact with the rear face of the insulating substrate or the imaging device and applying a second adhesive between a side portion upper end of the disposed shield and a rear face of the large-diameter portion of the lens holder;

pressing the insulating substrate against a front face of a mounting board in such a manner that the bottom portion of the shield is inserted between the mounting board and the insulating substrate or the imaging device; and curing the second adhesive in such a state that the bottom portion of the shield is inserted between the mounting board and the insulating substrate or the imaging device.

2. The method for manufacturing a camera module according to claim 1, wherein the plurality of solder balls on the rear face of the insulating substrate or on the imaging device and the bottom portion of the shield are in contact with the mounting board through a plurality of solder pastes formed on the mounting board.

3. The method for manufacturing a camera module according to claim 2, wherein the step of forming the plurality of solder balls on the rear face of the insulating substrate or on the imaging device includes forming the plurality of solder balls in such a manner that the height of the plurality of solder balls is higher than the thickness of the bottom portion of the shield.

* * * * *